United States Patent
Choi et al.

(10) Patent No.: US 9,416,243 B2
(45) Date of Patent: Aug. 16, 2016

(54) PHOTOCURABLE AND THERMOSETTING RESIN COMPOSITION, DRY FILM SOLDER RESIST MANUFACTURED THEREFROM, AND CIRCUIT BOARD INCLUDING THE SOLDER RESIST

(71) Applicant: LG CHEM, LTD., Seoul (KR)

(72) Inventors: Byung Ju Choi, Daejeon (KR); Woo Jae Jeong, Daejeon (KR); Bo Yun Choi, Daejeon (KR); Kwang Joo Lee, Daejeon (KR); Min Su Jeong, Daejeon (KR); Se Jin Ku, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/411,843

(22) PCT Filed: Jun. 17, 2014

(86) PCT No.: PCT/KR2014/005305
§ 371 (c)(1),
(2) Date: Dec. 29, 2014

(87) PCT Pub. No.: WO2014/204173
PCT Pub. Date: Dec. 24, 2014

(65) Prior Publication Data
US 2015/0191588 A1    Jul. 9, 2015

(30) Foreign Application Priority Data

Jun. 17, 2013  (KR) .................. 10-2013-0068961
Jun. 16, 2014  (KR) .................. 10-2014-0072906

(51) Int. Cl.
*G03F 7/027* (2006.01)
*C08K 3/04* (2006.01)
*C08K 3/08* (2006.01)
*C09D 133/06* (2006.01)

(52) U.S. Cl.
CPC ... *C08K 3/04* (2013.01); *C08K 3/08* (2013.01); *C09D 133/068* (2013.01); *G03F 7/027* (2013.01); *C08L 2312/06* (2013.01)

(58) Field of Classification Search
CPC .......... G03F 7/004; G03F 7/027; G03F 7/028
See application file for complete search history.

(56) References Cited

U.S. PATENT DOCUMENTS

| | | | |
|---|---|---|---|
| 5,616,650 A * | 4/1997 | Becker et al. ................ | 525/102 |
| 2003/0047269 A1* | 3/2003 | Tatsumi et al. ............... | 156/154 |
| 2005/0142362 A1* | 6/2005 | Inaoka et al. ............. | 428/411.1 |
| 2006/0004140 A1* | 1/2006 | Asano et al. .................... | 525/31 |
| 2007/0142528 A1* | 6/2007 | Oshima et al. ................ | 524/430 |
| 2013/0143981 A1 | 6/2013 | Miyata et al. | |

FOREIGN PATENT DOCUMENTS

| | | |
|---|---|---|
| CN | 103109234 A | 5/2013 |
| JP | 2004359712 A | 12/2004 |
| JP | 2007317945 A | 6/2007 |
| JP | 2010014767 A | 1/2010 |
| JP | 2010181825 A | 8/2010 |
| KR | 10-2006-0123230 A | 12/2006 |
| KR | 100745692 B1 | 7/2007 |
| KR | 1020080005871 A | 1/2008 |
| KR | 100849585 B1 | 7/2008 |
| KR | 1020120009641 A | 2/2012 |
| KR | 1020120060938 A | 6/2012 |
| KR | 1020120107373 A | 10/2012 |
| KR | 10-2013-0049520 A | 5/2013 |
| TW | 200921202 A | 5/2009 |

OTHER PUBLICATIONS

Machine translation of KR 10-2006-0123230, published in Dec. 2006.*
Machine translation of KR 10-2013-0049520, published in May 2013.*
PCT Search Report and Written Opinion in PCT/KR2014/005305, dated Jun. 17, 2014, 10 pages.

* cited by examiner

Primary Examiner — Anca Eoff
(74) Attorney, Agent, or Firm — Rothwell, Figg, Ernst & Manbeck, P.C.

(57) ABSTRACT

The present invention relates to a photocurable and thermosetting resin composition, including an acid modified oligomer, a photopolymerizable monomer, a thermosetting binder resin, a photoinitiator, two or more kinds of spherical alumina particles having different particle diameters from each other, and an organic solvent, a dry film solder resist obtained from the resin composition, and a circuit board including the dry film solder resist.

22 Claims, No Drawings

PHOTOCURABLE AND THERMOSETTING RESIN COMPOSITION, DRY FILM SOLDER RESIST MANUFACTURED THEREFROM, AND CIRCUIT BOARD INCLUDING THE SOLDER RESIST

CROSS REFERENCE TO RELATED APPLICATIONS

This application is a 35 U.S.C. §371 National Phase Entry Application from PCT/KR2014/005305, filed Jun. 17, 2014, and designating the United States, which claims priority under 35 U.S.C. §119 to Korean Patent Application No. 10-2014-0072906, filed on Jun. 16, 2014, and Korean Patent Application No. 10-2013-0068961, filed on Jun. 17, 2013, which are incorporated herein by reference in their entireties.

FIELD OF THE INVENTION

The present invention relates to a photocurable and thermosetting resin composition, a dry film solder resist, and a circuit board.

BACKGROUND OF THE INVENTION

As various electronic devices are miniaturized and weight-lightened, a photosensitive protective film capable of forming a minute opening pattern has been used in a printed circuit board (PCB), a semiconductor package substrate, a flexible printed circuit board (FPCB), and the like.

The protective film, also called a solder resist, generally requires developability, a high-resolution property, an insulating property, soldering thermal resistance, gold plating resistance, and the like. Particularly, the solder resist for a package substrate requires, in addition to such properties, for example, crack resistance to a temperature cycle test (TCT) of 55° C. to 125° C., or a highly accelerated stress test (HAST) property between fine wires.

Recently, as the solder resist, a dry film type of solder resist (DFSR, dry film solder resist) having good uniformity of film thickness, surface smoothness, and thin film formability has been drawing attention.

Using such a dry film solder resist, a process for forming the resist may be simplified, and the effect of a reduced amount of solvent discharge when forming the resist may be obtained.

Meanwhile, a semiconductor package article is configured with composite materials including a nonconductor such as an epoxy molding and a solder resist, a semiconductor such as a chip die, a conductor such as a circuit board pattern, and the like, and in order to manufacture this article, various processes involving severe thermal shock conditions should be performed.

However, since each component included in the semiconductor package article, for example, a nonconductor, a semiconductor, or a conductor has different coefficients of thermal expansion (CTE) from each other, dimensional stability may be greatly decreased, or a warpage phenomenon may occur.

The decrease in dimensional stability and the warpage phenomenon as such, when connecting a chip die and a semiconductor substrate with a solder ball or a gold wire, may cause a discrepancy in positions between a chip and a substrate, and also cracks and breakage of an article may be generated by shear stress, which may shorten the life of the article.

In addition, as the thickness of a substrate is decreased, the decrease in dimensional stability or the warpage phenomenon may be more deepened. Thus, according to a tendency of miniaturization and weight-lightening of various electronic devices, substrate materials and a solder resist having a lower coefficient of thermal expansion are more demanded.

Currently, according to a tendency of lightening, thinning, shortening, and miniaturization of electronic devices and components, the integration degree of electrical elements is being increased, and the heating value of an electrical element operating with electrical energy is being greatly increased.

Accordingly, there is a growing demand for improving heat radiation for effectively dispersing and emitting heat generated from the Inside of the electronic device.

Thus, measures for improving heat radiation for effectively dispersing and emitting heat generated from the electrical element have been variously studied.

For example, in order to improve the heat radiation property of various electrical elements, methods such as equipping a heat sink plate for conducting heat to release it outside, or of equipping a silicone rubber sheet and the like having excellent thermal conductivity, have been suggested. However, with such a heat sink plate, silicone rubber sheet, or the like, it has been difficult to firmly and closely adhere it to electrical elements, and there has been a limitation of not fully exhibiting the heat radiation property.

DETAILED DESCRIPTION OF THE INVENTION

Technical Objectives

The present invention has been made in an effort to provide a photocurable and thermosetting resin composition having advantages of providing a dry film solder resist (DFSR) not only having an excellent photocuring property, plating resistance, mechanical property, and thermal resistance, but that is also capable of minimizing a dimensional stability decreasing phenomenon and a warpage phenomenon, and having a high heat radiation property.

Further, the present invention has been made in an effort to provide a dry film solder resist obtained from the photocurable and thermosetting resin composition.

In addition, the present invention has been made in an effort to provide a circuit board including the dry film solder resist.

Technical Solutions

There is provided a photocurable and thermosetting resin composition including an acid modified oligomer, a photopolymerizable monomer, a thermosetting binder resin, a photoinitiator, two or more kinds of spherical alumina particles having different particle diameters from each other, a carbon compound having a surface coated with a thermal conductive ceramic compound, and an organic solvent.

And, there is provided a dry film solder resist (DFSR) prepared by using the photosensitive resin composition.

In addition, there is provided a circuit board including the dry film solder resist.

Hereinafter, a photocurable and thermosetting resin composition, a dry film solder resist, and a circuit board according to specific exemplary embodiments of the present invention will be described in more detail.

According to one exemplary embodiment of the present invention, a photocurable and thermosetting resin composition, including an acid modified oligomer, a photopolymerizable monomer, a thermosetting binder resin, a photoinitiator, two or more kinds of spherical alumina particles having different particle diameters from each other, a carbon compound having a surface coated with a thermal conductive ceramic compound, and an organic solvent, is provided.

In order to improve various physical properties of a dry film solder resist (DFSR), for example, physical properties such as development, PCT thermal resistance, glass transition temperature, and coefficient of thermal expansion, various fillers are being applied. However, if the content of the filler is excessive, the filler may be precipitated or agglomerated, thereby deteriorating the physical properties and quality of the finally manufactured DFSR or a circuit board.

On the contrary, the photocurable and thermosetting resin composition according to one exemplary embodiment of the present invention includes two or more kinds of spherical alumina particles having different particle diameters from each other, thereby improving thermal resistance without decreasing various physical properties while greatly increasing the content of the inorganic filler, capable of decreasing a coefficient of linear expansion, and capable of greatly improving a heat radiation property while not decreasing an insulating property of the manufactured dry film solder resist.

Further, by using the photocurable and thermosetting resin composition according to one exemplary embodiment of the present invention, a dry film type of solder resist may be provided, and accordingly, the decrease in preserving stability following the precipitation or agglomeration of the filler which was problematic in a liquid solder resist known in the prior art may be solved.

Further, by using the photocurable and thermosetting resin composition, a dry film solder resist (DFSR) not only having an excellent photocuring property, plating resistance, mechanical property, and thermal resistance, but also minimizing a dimensional stability decreasing phenomenon and a warpage phenomenon with a low coefficient of thermal expansion, may be provided.

As described above, the photocurable and thermosetting resin composition may include two or more kinds of spherical alumina particles having different particle diameters from each other.

As such, by including the two or more kinds of the spherical alumina particles having different particle diameters from each other, the pore size between the spherical alumina particles in a resin matrix may be minimized, thereby greatly improving a heat radiation effect.

As the two or more kinds of the spherical alumina particles having different particle diameters from each other are used, a greater synergy effect or combined effect may be implemented as compared with the quantitative sum of the effects generated from the use of each of the two kinds of spherical alumina particles.

The above spherical alumina particles are alumina particles having a spherical or nearly spherical three-dimensional shape.

At least one kind of the spherical alumina particles of the two or more kinds of the spherical alumina particles having different particle diameters from each other may have a particle diameter of 0.1 μm or less, for example, 0.01 μm to 0.1 μm.

Further, at least one kind of the spherical alumina particles of the two or more kinds of the spherical alumina particles having different particle diameters from each other may have a particle diameter of 0.2 μm to 0.7 μm.

Accordingly, the two or more kinds of the spherical alumina particles having different particle diameters from each other may include one kind of the spherical alumina particles having a particle diameter of 0.1 μm or less, and another kind of the spherical alumina particles having a particle diameter of 0.2 μm to 0.7 μm.

The photocurable and thermosetting resin composition may include 1% to 75% by weight of the two or more kinds of the spherical alumina particles having different particle diameters from each other.

If the content of the spherical alumina particles is too low, it may be difficult to sufficiently implement the heat radiation property, and if the content of the spherical alumina particles is too high, the uniformity of the photocurable and thermosetting resin composition may be deteriorated, or a coating operation may not be easily operated, so that the film and the like is difficult to form, and reduced adhesion may prevent easy adhesion to a PCB and the like.

Meanwhile, the photocurable and thermosetting resin composition may include a carbon compound having a surface coated with a thermal conductive ceramic compound, in order to greatly improve a heat radiation property without decreasing an insulating property of the manufactured dry film solder resist.

The thermal conductive ceramic compound may be included in the photocurable and thermosetting resin composition so as to be coated on the surface of the carbon compound, such that heat generated in electrical elements and the like may be rapidly transferred.

Specific examples of such thermal conductive ceramic compound may include alumina ($Al_2O$), boron nitride (BN), aluminum nitride (AlN), silicon carbide (SiC), magnesium oxide (MgO), zinc oxide (ZnO), aluminum hydroxide ($Al(OH)_3$), or mixtures thereof, and preferably, alumina or magnesium oxide may be used.

Further, by coating the surface of the carbon compound with the thermal conductive ceramic compound, excellent dielectric strength may be implemented while maintaining a high thermal conductivity property of the carbon compound, and may further increase compatibility with other components included in the photocurable and thermosetting resin composition.

The carbon compound having a surface coated with the thermal conductive ceramic compound may include 0.5% to 20% by weight of the thermal conductive ceramic compound, and 80% to 99.5% by weight of the carbon compound, or the carbon compound having a surface coated with the thermal conductive ceramic compound may include 1% to 10% by weight of the thermal conductive ceramic compound, and 90% to 99% by weight of the carbon compound.

If the content of the thermal conductive ceramic compound is too low, the photocurable and thermosetting resin composition of the one exemplary embodiment or an article prepared therefrom may not sufficiently secure physical properties such as dielectric strength or electrical insulation, and as a result, is not applicably used as an Insulation film for electronic materials.

Further, if the content of the thermal conductive ceramic compound is too high, agglomeration between the fillers may occur in the course of surface treatment, thereby making the resin unsuitable for use for a dispersion process.

The specific examples of the carbon compound may include carbon nanotubes, graphene, graphite, or mixtures thereof, and preferably, the carbon nanotubes may be used.

The carbon compound having a surface coated with the thermal conductive ceramic compound may have an average particle diameter of 0.5 μm to 4 μm.

The photocurable and thermosetting resin composition may include 1.1% by weight or less, preferably 0.2% to 1.0% by weight, of the carbon compound having a surface coated with the thermal conductive ceramic compound.

If the content of the carbon compound having a surface coated with the thermal conductive ceramic compound in the resin composition is too low, the effect of improving the thermal conductivity may not be so noticeable, and if the content is 1.1% by weight or more, the insulating property may be greatly reduced.

Meanwhile, as the acid modified oligomer included in the photocurable and thermosetting resin composition, all components previously known to be usable in a resin composition for forming the DFSR, which is an oligomer having a photocurable functional group, for example, an acrylate group or a photocurable functional group having an unsaturated double bond and a carboxyl group in the molecule, may be used without any limitation.

For example, the main chain of such additional acid modified oligomer may be a novolac epoxy or polyurethane, and the like, and a component where a carboxyl group, an acrylate group, and the like are introduced to such a main chain may be used as an additional acid modified oligomer.

The photocurable functional group may preferably be an acrylate group. Herein, the acid modified oligomer may be obtained as an oligomer form by copolymerizing of a polymerizable monomer having a carboxyl group and a monomer including an acrylate-based compound, and the like.

Particularly, specific examples of the additional acid modified oligomer usable for the resin composition include the following components:

(1) a carboxyl group-containing resin obtained by copolymerizing (a) an unsaturated carboxylic acid such as (meth)acrylic acid and (b) a compound having an unsaturated double bond such as styrene, α-methylstyrene, a lower alkyl(meth)acrylate, and isobutylene;

(2) a carboxyl group-containing photosensitive resin obtained by reacting a part of a copolymer of (a) an unsaturated carboxylic acid and (b) a compound having an unsaturated double bond with a compound having an ethylenic unsaturated group such as a vinyl group, an allyl group, and a (meth)acryloyl group, and a reactive group such as an epoxy group and an acid chloride, for example, glycidyl (meth)acrylate, and adding an ethylenic unsaturated group as a pendent group;

(3) a carboxyl group-containing photosensitive resin obtained by reacting (a) an unsaturated carboxylic acid with a copolymer of (b) a compound having an unsaturated double bond and (c) a compound having an epoxy group and an unsaturated double bond such as glycidyl (meth)acrylate and α-methyl glycidyl (meth)acrylate, and reacting the resulting secondary hydroxyl group with (d) a saturated or unsaturated polybasic acid anhydride such as anhydrous phthalic acid, tetrahydro anhydrous phthalic acid, and hexahydro anhydrous phthalic acid;

(4) a carboxyl group-containing photosensitive resin obtained by reacting a copolymer of (e) an acid anhydride having an unsaturated double bond such as anhydrous maleic acid and anhydrous itaconic acid, and (b) a compound having an unsaturated double bond with (f) a compound having one hydroxyl group and one or more ethylenic unsaturated double bonds such as hydroxyalkyl (meth)acrylate;

(5) a carboxyl group-containing photosensitive compound obtained by carrying out esterification (entire esterification or partial esterification, preferably entire esterification) of an epoxy group of (g) a polyfunctional epoxy compound having two or more epoxy groups in the molecule as follows, or a polyfunctional epoxy resin obtained by further epoxidizing a hydroxyl group of the polyfunctional epoxy compound with epichlorohydrin, and a carboxyl group of (h) an unsaturated monocarboxylic acid such as (meth)acrylic acid, and further reacting the produced hydroxyl group with (d) saturated or unsaturated polybasic acid anhydride;

(6) a carboxyl group-containing resin obtained by reacting an epoxy group of a copolymer of (b) a compound having an unsaturated double bond and glycidyl (meth)acrylate with (i) an organic acid with one carboxyl group in one molecule and without an ethylenic unsaturated bond such as an alkyl carboxylic acid containing 2 to 17 carbons and an aromatic group-containing alkyl carboxylic acid, and reacting the produced secondary hydroxyl group with (d) saturated or unsaturated polybasic acid anhydride;

(7) a carboxyl group-containing urethane resin obtained by carrying out a polyaddition reaction of (j) a diisocyanate such as aliphatic diisocyanate, branched aliphatic diisocyanate, alicyclic diisocyanate, and aromatic diisocyanate, (k) a carboxyl group-containing dialcohol compound such as dimethylolpropionic acid and dimethylolbutanoic acid, and (m) a diol compound such as a polycarbonate-based polyol, a polyether-based polyol, a polyester-based polyol, a polyolefin-based polyol, an acryl-based polyol, a bisphenol A-based alkylene oxide adduct diol, and a compound having a phenolic hydroxyl group and an alcoholic hydroxyl group;

(8) a photosensitive carboxyl group-containing urethane resin obtained by carrying out a polyaddition reaction of (j) a diisocyanate, (n) a (meth)acrylate of a difunctional epoxy resin such as a bisphenol A type of epoxy resin, a hydrogen addition bisphenol A type of epoxy resin, a brominated bisphenol A type of epoxy resin, a bisphenol F type of epoxy resin, a bisphenol S type of epoxy resin, a bixylenol type of epoxy resin, and a biphenol type of epoxy resin, or a modified partial acid anhydride thereof, (k) a carboxyl group-containing a dialcohol compound, and (m) a diol compound;

(9) a carboxyl group-containing urethane resin where an unsaturated double bond is introduced to the terminal, by adding (f) a compound having one hydroxyl group and one or more ethylenic unsaturated double bonds such as hydroxyalkyl (meth)acrylate during synthesis of the resin of (7) or (8) above;

(10) a carboxyl group-containing urethane resin obtained by adding a compound having one isocyanate group and one or more (meth)acryloyl groups in the molecule such as an equimolar reactant of isophorone diisocyanate and pentaerythritol triacrylate during synthesis of the resin of (7) or (8) above, and carrying out terminal (meth)acrylation;

(11) a carboxyl group-containing photosensitive resin obtained by reacting a polyfunctional oxetane compound having two or more oxetane rings in the molecule as follows with (h) unsaturated monocarboxylic acid to produce a modified oxetane compound, and reacting a primary hydroxyl group in the modified oxetane compound with (d) a saturated or unsaturated polybasic acid anhydride;

(12) a carboxyl group-containing photosensitive resin obtained by introducing an unsaturated double bond to a reaction product of a bisepoxy compound and bisphenols, and continuously reacting the (d) saturated or unsaturated polybasic acid anhydride;

(13) a carboxyl group-containing photosensitive resin obtained by reacting a reaction product of a novolac type of phenol resin with an alkylene oxide such as ethylene oxide, propylene oxide, butylene oxide, trimethylene oxide, tetrahydrofuran, and tetrahydropyran, and/or a cyclic carbonate such as ethylene carbonate, propylene carbonate, butylene carbonate and 2,3-carbonate propyl methacrylate with (h) unsaturated monocarboxylic acid, and reacting the obtained reaction product with the (d) saturated or unsaturated polybasic acid anhydride; and commercially available components as the above-described additional acid modified oligomers, specifically, for example, ZAR-2000, CCR-1235, ZFR-1122, or CCR-1291H from Nippon Kayaku, Co., Ltd., and the like.

A more specific example of the acid modified oligomer may include an epoxy (meth)acrylate-based compound.

The epoxy (meth)acrylate-based compound is a reaction product between 1) an epoxy compound or a polyepoxy compound and 2) a (meth)acrylate-based compound or a hydroxy (meth)acrylate-based compound.

As the epoxy (meth)acrylate-based compound is used, flexibility of the DFSR may be sufficiently secured, a lower coefficient of thermal expansion and improved heat resistance reliability are shown, and DFSR preferably usable as package substrate materials of a semiconductor element and the like may be provided.

As the epoxy (meth)acrylate-based compound, an epoxy (meth)acrylate compound derived from cresol novolac or an epoxy (meth)acrylate compound derived from bisphenol F may be used.

Further, the epoxy (meth)acrylate-based compound may contain the epoxy (meth)acrylate compound derived from cresol novolac and the epoxy (meth)acrylate compound derived from bisphenol F at a weight ratio of 4:1 to 1:1, or 3:1 to 2:1.

The epoxy (meth)acrylate-based compound may have a weight average molecular weight of 5000 to 50,000, or 6000 to 20,000. If the weight average molecular weight of the epoxy (meth)acrylate-based compound is too high, the ratio of the photocurable acrylate may be relatively decreased, thereby decreasing developability, or decreasing the strength of the DFSR. If the weight average molecular weight of the epoxy (meth)acrylate-based compound is too low, precipitation or agglomeration of inorganic filler particles may occur at the time of dispersing the inorganic filler, and the resin composition of one exemplary embodiment may be excessively developed.

The above-described acid modified oligomer may be contained in an amount of about 5% to 75% by weight, or about 20% to 50% by weight, or about 25% to 45% by weight, relative to a total weight of the resin composition of one exemplary embodiment. If the content of the acid modified oligomer is too low, the developability of the resin composition may be poor, and the strength of the DFSR may be decreased. In contrast, if the content of the acid modified oligomer is too high, the resin composition may be excessively developed, and the uniformity in coating may be poor.

The photopolymerizable monomer may contain one or more compounds selected from the group consisting of polyfunctional compounds having two or more vinyl groups in the molecule, and polyfunctional (meth)acrylate compounds having two or more (meth)acryloyl groups in the molecule.

Such photopolymerizable monomer may be, for example, a compound having photocurable unsaturated functional groups such as two or more polyfunctional vinyl groups, and form a cross-linkage with an unsaturated functional group of the above-described acid modified oligomer, thereby forming a crosslinked structure by photocuring at the time of exposure.

Thereby, the resin composition on an exposed area corresponding to the part where the DFSR will be formed may be allowed to remain on the substrate without being alkali-developed.

Such photopolymerizable monomer may be a liquid at room temperature, and accordingly, may also serve to adjust the viscosity of the resin composition of one exemplary embodiment according to a coating method, or further improve the alkali-developability of an unexposed area.

As such a photopolymerizable monomer, an acrylate-based compound having two or more photocurable unsaturated functional groups may be used, and as specific examples thereof, one or more compounds selected from the group consisting of a hydroxyl group-containing acrylate-based compound such as 2-hydroxyethyl acrylate, 2-hydroxypropyl acrylate, pentaerythritol triacrylate, or dipentaerythritol pentaacrylate; a water-soluble acrylate-based compound such as polyethylene glycol diacrylate or polypropylene glycol diacrylate; a polyfunctional polyesteracrylate-based compound of a polyhydric alcohol such as trimethylolpropane triacrylate, pentaerythritol tetraacrylate, or dipentaerythritol hexaacrylate; an acrylate-based compound of an ethylene oxide adduct and/or a propylene oxide adduct of polyfunctional alcohol such as trimethylolpropane or hydrogen-added bisphenol A, or a polyhydric phenol such as bisphenol A or biphenol; a polyfunctional or monofunctional polyurethane acrylate-based compound which is a modified isocyanate of the hydroxyl group-containing acrylate; an epoxyacrylate-based compound which is a (meth)acrylic acid adduct of bisphenol A diglycidyl ether, hydrogen-added bisphenol A diglycidyl ether or phenol novolac epoxy resin; a caprolactone-modified acrylate-based compound such as caprolactone-modified ditrimethylolpropane tetraacrylate, an acrylate of ε-caprolactone-modified dipentaerythritol or caprolactone-modified hydroxypivalic acid neopentyl glycol ester diacrylate; and a photosensitive (meth)acrylate compound such as a methacrylate-based compound corresponding to the above-described acrylate-based compound may be used alone, or in combination with two or more of these compounds.

Among these, as the photopolymerizable monomer, a polyfunctional (meth)acrylate-based compound having two or more (meth)acryloyl groups in one molecule may be preferably used, and especially pentaerythritol triacrylate, trimethylolpropane triacrylate, dipentaerythritol hexaacrylate, caprolactone modified ditrimethylol propane tetraacrylate, or the like may be appropriately used.

A commercially available photopolymerizable monomer may include DPEA-12 from Kayarad, and the like.

The content of the above-described photopolymerizable monomer may be about 1% to 40% by weight, or about 5% to 30% by weight, or about 7% to 15% by weight, relative to the total weight of the resin composition.

If the content of the photopolymerizable monomer is too low, photocuring may not sufficiently occur, and if the content is too high, the dryness of the DFSR may be poor, and the physical properties may be decreased.

The photoinitiator may include one or more selected from the group consisting of a benzoin-based compound, an acetophenone-based compound, an anthraquinone-based compound, a thioxanthone compound, a ketal compound, a benzophenone-based compound, an α-aminoacetophenone compound, an acylphosphine oxide compound, an oxime ester compound, a biimidazole-based compound, and a triazine-based compound.

Specifically, as the photoinitiator, any known ones, for example, benzoin and its alkyl ethers, such as benzoin, benzoin methyl ether, and benzoin ethyl ether; acetophenones such as acetophenone, 2,2-dimethoxy-2-phenylacetophenone, 1,1-dichloroacetophenone, and 4-(1-t-butyldioxy-1-methylethyl)acetophenone; anthraquinones such as 2-methylanthraquinone, 2-amylanthraquinone, 2-t-butylanthraquinone, and 1-chloroanthraquinone; thioxanthones such as 2,4-dimethylthioxanthone, 2,4-diisopropylthioxanthone, and 2-chlorothioxanthone; ketals such as acetophenonedimethylketal and benzyldimethylketal;

benzophenones such as benzophenone, 4-(1-t-butyldioxy-1-methylethyl)benzophenone, and 3,3',4,4'-tetrakis(t-butyldioxycarbonyl)benzophenone may be used.

Further, ε-aminoacetophenones such as 2-methyl-1-[4-(methylthio)phenyl]-2-morpholinopropanon-1,2-benzyl-2-dimethyl amino-1-(4-morpholinophenyl)-butan-1-on, 2-(dimethylamino)-2-[(4-methylphenyl)methyl]-1-[4-(4-morpholinyl)phenyl]-1-butanone, and N,N-dimethylaminoacetophenone (commercially available as Irgacure® 907, Irgacure 369, and Irgacure 379 from Ciba Specialty Chemicals Co., Ltd. (currently Ciba Japan K.K.) etc.), or acylphosphine oxides such as 2,4,6-trimethylbenzoyldiphenylphosphine oxide, bis(2,4,6-trimethylbenzoyl)-phenylphosphine oxide, and bis(2,6-dimethoxybenzoyl)-2,4,4-trimethylpentylphosphine oxide (commercially available as Luciline®@TPO from BASF Corporation, and as Irgacure 819 from Ciba Specialty Chemicals Co., Ltd., etc.) may be mentioned as a preferred photoinitiator.

Further, a preferred photoinitiator may include oxime esters. The specific examples of the oxime esters may include 2-(acetyloxyiminomethyl)thioxanthen-9-one, (1,2-octanedione, 1-[4-(phenylthio)phenyl]-, 2-(O-benzoyloxime)), (ethanone, 1-[9-ethyl-6-(2-methylbenzoyl)-9H-carbazol-3-yl]-, 1-(O-acetyloxime)), and the like. The commercially available products may include GGI-325, Irgacure OXE01, and Irgacure OXE02 from Ciba Specialty Chemicals, Co., Ltd, N-1919 from ADEKA Corporation, Darocur TPO from Ciba Specialty Chemicals, Co., Ltd., and the like The content of the photoinitiator may be about 0.1% to 20% by weight, or about 1% to 10% by weight, or about 1% to 5% by weight, relative to the total weight of the resin composition.

If the content of the photoinitiator is too low, photocuring may not occur properly, and if the content is too high, the resolution of the resin composition may be decreased, or the reliability of the DFSR may not be sufficient.

The thermosetting binder resin may contain one or more functional groups selected from the group consisting of an epoxy group, an oxetanyl group, a cyclic ether group, and a cyclic thioether group.

The resin composition of one exemplary embodiment of the present invention may further include a thermosetting binder having one or more selected from the group consisting of a functional group capable of thermosetting, for example, an epoxy group, an oxetanyl group, a cyclic ether group, and a cyclic thioether group. Such thermosetting binder may form a cross-linkage with the acid modified oligomer and the like by thermosetting, thereby guaranteeing thermal resistance or mechanical properties of the DFSR.

Such thermosetting binder may have a softening point of about 70 to 100° C., through which unevenness in the lamination may be reduced. If the softening point is low, the tackiness of the DFSR may be increased, and if it is high, the flowability may be deteriorated.

As the thermosetting binder, a resin having two or more cyclic ether groups and/or cyclic thioether groups (hereinafter referred to as cyclic (thio)ether groups) in the molecule, and also a difunctional epoxy resin may be used. Other diisocyanates and difunctional block isocyanates may also be used.

The thermosetting binder having two or more cyclic (thio)ether groups in the molecule may be a compound having two or more of either or both of a cyclic ether group and a cyclic thioether group with a 3-, 4-, or 5-membered ring in the molecule.

Further, the thermosetting binder may be a polyfunctional epoxy compound having at least two epoxy groups in the molecule, a polyfunctional oxetane compound having at least two oxetanyl groups in the molecule, an episulfide resin having two or more thioether groups in the molecule, or the like.

The specific examples of the polyfunctional epoxy compound may include a bisphenol A type of epoxy resin, a hydrogen-added bisphenol A type of epoxy resin, a brominated bisphenol A type of epoxy resin, a bisphenol F type of epoxy resin, a bisphenol S type of epoxy resin, a novolac type of epoxy resin, a phenol novolac type of epoxy resin, a cresol novolac type of epoxy resin, an N-glycidyl type of epoxy resin, a novolac type of epoxy resin of bisphenol A, a bixylenol type of epoxy resin, a biphenol type of epoxy resin, a chelate type of epoxy resin, a glyoxal type of epoxy resin, an amino group-containing epoxy resin, a rubber modified epoxy resin, a dicyclopentadiene phenolic type of epoxy resin, a diglycidyl phthalate resin, a heterocyclic epoxy resin, a tetraglycidyl xylenoylethane resin, a silicone modified epoxy resin, an ε-caprolactone modified epoxy resin, and the like.

Further, for imparting flame retardancy, phosphorus may be introduced to the structure.

Such epoxy resin may have improved properties such as close adhesion to cured coating, thermal resistance of solder, or electroless plating resistance, by thermosetting.

The polyfunctional oxetane compound may include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methylacrylate, (3-ethyl-3-oxetanyl)methylacrylate, (3-methyl-3-oxetanyl)methylmethacrylate, (3-ethyl-3-oxetanyl)methylmethacrylate, or oligomers or copolymers thereof, and also etherified product of oxetane alcohol with a resin having a hydroxyl group such as a novolac resin, poly(p-hydroxystyrene), cardo-type bisphenols, calix arenes, calix resorcinarenes, or silsesquioxane.

In addition, a copolymer of an unsaturated monomer having an oxetane ring and alkyl(meth)acrylate may be included.

The compound having two or more cyclic thioether groups in the molecule may include, for example, a bisphenol A type of episulfide resin YL7000 from Japan Epoxy Resin, Co., Ltd., etc.

Further, an episulfide resin obtained by replacing an oxygen atom of the epoxy group in the novolac type of epoxy resin with a sulfur atom may be used.

Further, YDCN-500-80P available from Kukdo Chemical Co., Ltd., etc. may be used as a commercially available product.

The photocurable and thermosetting resin composition may include 0.5% to 40% by weight of a thermosetting binder.

Further, the thermosetting binder may be included in the content corresponding to about 0.8 to 2.0 equivalents, relative to 1 equivalent carboxyl group of the acid modified oligomer.

If the content of the thermosetting binder is too low, a carboxyl group may remain in the DFSR after curing, thereby decreasing thermal resistance, alkali resistance, electrical insulation, and the like. In contrast, if the content is too high, a cyclic (thio)ether group with a low molecular weight may remain in a dry coated film, thereby decreasing the strength of the coated film and the like, which is undesirable.

In order to dissolve the photocurable and thermosetting resin composition, or impart appropriate viscosity, one or more solvents may be mixed therewith and used.

The solvent may include ketones such as methyl ethyl ketone and cyclohexanone; aromatic hydrocarbons such as toluene, xylene, and tetramethyl benzene; glycol ethers (cellosolve) such as ethylene glycol monoethylether, ethylene glycol monomethylether, ethylene glycol monobutylether, diethylene glycol monoethylether, diethylene glycol monomethylether, diethylene glycol monobutylether, propylene glycol monomethylether, propylene glycol monoethylether, dipropylene glycol diethylether, and triethylene glycol monoethylether, acetic acid esters such as ethyl acetate, butyl acetate, ethylene glycol monoethylether acetate, ethylene glycol monobutylether acetate, diethylene glycol monoethylether acetate, diethylene glycol monobutylether acetate, propylene glycol monomethylether acetate, and dipropylene glycol monomethylether acetate; alcohols such as ethanol, propanol, ethylene glycol, propylene glycol, and carbitol; an aliphatic hydrocarbon such as octane and decane; a petroleum-based solvent such as petroleum ether, petroleum naphtha, hydrogen-added petroleum naphtha, and solvent naphtha; and amides such as dimethyl acetamide and dimethylformamide (DMF).

These solvents may be used alone or in mixture of two or more.

The content of the solvent may be about 1% to 90% by weight, or 10% to 50% by weight, relative to the total weight of the above-described resin composition.

The photocurable and thermosetting resin composition may further include one or more inorganic filler selected from the group consisting of barium sulfate, barium titanate, amorphous silica, crystalline silica, fused silica, spherical silica, talc, clay, magnesium carbonate, calcium carbonate, aluminum oxide, aluminum hydroxide, and mica.

The inorganic filler may serve to improve thermal resistance stability, dimensional stability by heat, and resin adhesion.

Further, it reinforces color, thereby serving as an extender pigment.

The amount of the inorganic filler used may be adjusted in consideration of the physical properties or quality of the finally manufactured dry film solder resist.

In the photocurable and thermosetting resin composition, the sum of the contents of the two or more kinds of spherical alumina particles having different particle diameters from each other and the inorganic filler may be 30% to 60% by weight, based on the solid content excluding the organic solvent.

The solid content means the components except for the organic solvent in the photocurable and thermosetting resin composition, for example, the components including all of the acid modified oligomer, the photopolymerizable monomer, the thermosetting binder resin, the photoinitiator, and the two or more kinds of spherical alumina particles having different particle diameters from each other.

The photocurable and thermosetting resin composition may further include a thermosetting agent, a pigment, a leveling agent, or a dispersant.

The thermosetting agent serves to promote the thermosetting of the thermosetting binder.

Such thermosetting agent may include, for example, imidazole and imidazole derivatives such as 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; an amine compound such as dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine; a hydrazine compound such as adipic acid dihydrazide and sebacic acid dihydrazide; and a phosphorus compound such as triphenylphosphine.

Further, it is commercially available as, for example, 2MZ-A, 2MZ-OK, 2PHZ, 2P4BHZ, 2P4MHZ (all product names of imidazole-based compounds) from Shikoku Chemicals Corporation, U-CAT3503N, UCAT3502T (all product names of block isocyanate compounds of dimethylamine), DBU, DBN, U-CATS A102, U-CAT5002 (all product names of bicyclic amidine compounds and their salts) from San-Apro Uimited, and the like.

It may promote the thermosetting catalyst of an epoxy resin or an oxetane compound, or the reaction of an epoxy group and/or an oxetanyl group and a carboxyl group, but is not particularly limited thereto, and may be used alone or in mixture of two or more.

Further, S-triazine derivatives such as guanamine, acetoguanamine, benzoguanamine, melamine, 2,4-diamino-6-methacryloyloxyethyl-S-triazine, 2-vinyl-4,6-diamino-S-triazine, a 2-vinyl-4,6-dimamino-S-triazine isocyanuric acid adduct, and a 2,4-diamino-6-methacryloyloxyethyl-S-triazine isocyanuric acid adduct may be used, and preferably these compounds which also function as a close adhesion imparting agent may be used in combination with the thermosetting agent.

The content of the thermosetting agent may be, in view of the appropriate thermosetting, about 0.3% to 15% by weight, relative to the total weight of the resin composition.

The pigment may serve to exert visibility and hiding power, thereby hiding defects such as a scratch of a circuit line.

Usable pigments may include red, blue, green, yellow, and black pigments, and the like.

As the blue pigments, Phthalocyanine Blue, Pigment Blue 15:1, Pigment Blue 15:2, Pigment Blue 15:3, Pigment Blue 15:4, Pigment Blue 15:6, Pigment Blue 60, and the like may be used.

As the green pigment, Pigment Green 7, Pigment Green 36, Solvent Green 3, Solvent Green 5, Solvent Green 20, Solvent Green 28, and the like may be used.

The yellow pigment may include anthraquinone-based, isoindolinone-based, condensed azo-based, and benzimidazolone-based pigments, and the like, and for example, Pigment Yellow 108, Pigment Yellow 147, Pigment Yellow 151, Pigment Yellow 166, Pigment Yellow 181, Pigment Yellow 193, and the like may be used.

It is preferred that the content of the pigment is about 0.5% to 3% by weight, relative to the total weight of the above-described resin composition.

If the content is less than 0.5% by weight, the visibility and the hiding power may be deteriorated, and if the content is above 3% by weight, the thermal resistance may be deteriorated.

Other usable additives may be components serving to defoam the resin composition, remove popping or craters on the surface in film coating, impart flame retardancy, or control viscosity, or as a catalyst.

Specifically, known and conventional additives, such as a known and conventional thickener such as pulverizing silica, organic bentonite, and montmorillonite; a defoamer and/or a leveling agent such as silicone-based, fluorine-based, and polymer-based ones; a silane coupling agent such as imidazole-based, thiazole-based, and triazole-based ones; and a flame retardant such as phosphorus-based and antimony-based flame retardants may be combined.

Among these, the leveling agent serves to remove popping or craters on the surface in film coating, and for example, BYK-380N, BYK-307, BYK-378, and BYK-350 from BYK-Chemie GmbH and the like may be used.

It is preferred that the content of other additives is about 0.01% to 10% by weight, relative to the total weight of the resin composition.

The DFSR may be formed through the following process using the photocurable and thermosetting resin composition of the one exemplary embodiment.

First, a film is formed with the resin composition, is laminated on a predetermined substrate, and then the resin composition of the part where the DFSR will be formed is selectively exposed.

As such exposure proceeds, an unsaturated functional group contained in the acid modified oligomer and an unsaturated functional group contained in the photopolymerizable monomer cause photocuring to form a cross-linkage with each other, and as a result, a crosslinked structure in the exposed area may be formed by photocuring.

Thereafter, as development proceeds with an alkali-developing solution, the resin composition on the exposed area where a crosslinked structure is formed remains on the substrate as it is, and the rest of the resin composition on the unexposed area is dissolved in the developing solution to be removed.

Then, thermosetting proceeds by heat-treating the resin composition remained on the substrate. A carboxyl group contained in the acid modified oligomer, for example, an iminocarbonate-based compound, may react with a functional group capable of thermosetting in the thermosetting binder to form a cross-linkage, and as a result, a crosslinked structure is formed by thermosetting, so that the DFSR may be formed on a desired part of the substrate.

That is, in the case where the DFSR is formed using the resin composition, the cured resin composition forming the DFSR contains a basic crosslinked structure, and accordingly, the coefficient of thermal expansion of the DFSR may be decreased to 40 or less in $\alpha 1$, and to 150 or less in $\alpha 2$.

This leads to improved thermal resistance reliability of the DFSR, and a minimized warpage problem by a decreased difference of coefficients of thermal expansion between the DFSR and the package substrate materials of a semiconductor element.

Further, according to another exemplary embodiment of the present so invention, a dry film solder resist (DFSR) manufactured by using a photocurable and thermosetting resin composition including an acid modified oligomer, a photopolymerizable monomer, a thermosetting binder resin, a photoinitiator, two or more kinds of spherical alumina particles having different particle diameters from each other, a carbon compound having a surface coated with a thermal conductive ceramic compound, and an organic solvent, may be provided.

The dry film solder resist (DFSR) may not only fulfill the various physical properties such as PCT resistance, TCT thermal resistance, and HAST resistance between fine wires, which are required for the package substrate materials of the semiconductor element, but also decrease warpage, thereby reducing failures, and increasing life span of the product.

Further, the dry film solder resist (DFSR) may greatly increase the content of the inorganic filler, improve thermal resistance without deteriorating various physical properties, lower the coefficient of linear expansion, and greatly improve a heat radiation property without decreasing the insulating property of the manufactured dry film solder resist.

The dry film solder resist may contain the cured or dried product of the photosensitive resin composition.

The detailed description of the photocurable and thermosetting resin composition including the acid modified oligomer, the photopolymerizable monomer, the thermosetting binder resin, the photoinitiator, the two or more kinds of spherical alumina particles having different particle diameters from each other, and the organic solvent include the above description as to one exemplary embodiment of the present invention.

The dry film solder resist may have a thickness of 10 μm to 150 μm.

The process of manufacturing the dry film solder resist (DFSR) using the photocurable and thermosetting resin composition of one exemplary embodiment will be outlined in the following.

First, the resin composition of the one exemplary embodiment is coated on a carrier film as photosensitive coating materials with a comma coater, a blade coater, a lip coater, a rod coater, a squeeze coater, a reverse coater, a transfer roll coater, a gravure coater, a spraying coater or the like, and then passed through an oven at 50 to 130° C. for 1 to 30 minutes to be dried, and a release film is laminated thereon, so that a dry film consisting of a carrier film, a photosensitive film, and a release film from the bottom may be manufactured.

The photosensitive film may have a thickness of about 5 to 100 μm.

Herein, as the carrier film, a plastic film such as polyethylene terephthalate (PET), a polyester film, a polyimide film, a polyamideimide film, a polypropylene film, and a polystyrene film may be used, and as the release film, polyethylene (PE), a polytetrafluoroethylene film, a polypropylene film, surface-treated paper, and the like may be used. When the release film is released, it is preferred that the adhesion between the photosensitive film and the release film is lower than the adhesion between the photosensitive film and the carrier film.

Next, after releasing the release film, the photosensitive film layer is joined on the substrate on which a circuit is formed, using a vacuum laminator, a hot roll laminator, a vacuum press, or the like.

Next, the substrate is exposed to light having a constant wavelength range (UV, etc.).

Exposure is carried out selectively with a photomask, or directly with a laser direct exposure device to be patterned.

The carrier film is released after exposure.

An exposure amount depends on the thickness of a coated film, however, it is preferably 0 to 1000 mJ/cm$^2$.

As the exposure proceeds, for example, photocuring may occur on the exposed area to form a cross-linkage between unsaturated functional groups contained in the acid modified oligomer, the photopolymerizable monomer, and the like, and as a result, the exposed area may be in a state of not being removed by later development.

In comparison, the unexposed area may not have the cross-linkage and a crosslinked structure therefrom, formed therein, and retains the carboxyl group, thereby being in the state of being alkali-developable.

Next, development is carried out using an alkaline solution and the like.

As the alkaline solution, an alkaline aqueous solution such as potassium hydroxide, sodium hydroxide, sodium carbonate, potassium carbonate, sodium phosphate, sodium silicate, ammonia, and amines may be used.

By such development, only the film on the exposed area may remain.

Lastly, by heat curing (post cure), a printed circuit board including the solder resist formed from the photosensitive film is completed.

The heat curing temperature is appropriately 100° C. or more. By the above-described method, and the like, the DFSR and the printed circuit board including the same may be provided.

As the DFSR undergoes photocuring and thermosetting, it may include the acid modified oligomer, the photopolymerizable monomer having two or more photocurable unsaturated functional groups, and the cured thermosetting binder having the functional group capable of thermosetting.

The dry film solder resist may be used as a protective film for a printed circuit board.

The dry film solder resist may be used in the manufacture of a package substrate of a semiconductor element.

Further, according to another exemplary embodiment of the present invention, a circuit board including the dry film solder resist may be provided.

The manufacturing method of the circuit board is identical to the manufacturing process of the printed circuit board using the dry film solder resist as described above, and the dry film solder resist may be used as a protective film for a printed circuit board.

Advantageous Effect of the Invention

According to the present invention, a photocurable and thermosetting resin composition not only having an excellent photocuring property, plating resistance, mechanical properties, and thermal resistance, but also being capable of minimizing a dimensional stability decreasing phenomenon and a warpage phenomenon, and providing a dry film solder resist (DFSR) having high heat radiation property, may be provided.

Further, by using the photocurable and thermosetting resin composition, a dry film solder resist having the above-described properties, and a circuit board including the dry film solder resist, may be provided.

DETAILED DESCRIPTION OF THE EMBODIMENTS

The present invention will be described in more detail in the following examples. However, the following examples are to illustrate the present invention, and the scope of the present invention is not limited to the following examples.

EXAMPLES AND COMPARATIVE EXAMPLES

Manufacture of Resin Composition, Dry Film, and Printed Circuit Board

Examples 1 and 2 and Comparative Example 1

Resin compositions were prepared by mixing the components shown in the following Table 1. Herein, as the acid modified oligomer, a mixture of an epoxy (meth)acrylate compound derived from cresol novolac and an epoxy (meth)acrylate compound derived from bisphenol F at a weight ratio of 3:1 was used.

The resin composition prepared as above was applied to PET as a carrier film, and passed through an oven at 75° C. to be dried, and then PE was laminated as a release film, thereby manufacturing a dry film consisting of a carrier film, a photosensitive film (thickness 20 μm), and a release film from the bottom.

After releasing the cover film of the manufactured dry film, a photosensitive film layer was vacuum-laminated on the substrate where a circuit is formed, and a photomask corresponding to a circuit pattern was placed on the photosensitive film layer, and exposed to UV. Exposure proceeded with UV having wavelength range of 365 nm at an exposure amount of 350 mJ/cm$^2$.

Thereafter, the PET film was removed, and development with an alkaline solution of 1 wt % $Na_2CO_3$ at 31° C. was carried out for a period of time to remove an undesired part, thereby forming a desired pattern.

Subsequently, photocuring at an exposure amount of 1000 mJ/cm$^2$ was carried out, and lastly, heat curing at 160 to 170° C. proceeded for 1 hour, thereby completing a printed circuit board including a protective film (solder resist) formed from the photosensitive film.

TABLE 1

Compositions of Examples 1 to 2 and Comparative Example 1 (unit: g)

| Components | Component name (or Product name) | Comparative Example 1 | Example 1 | Example 2 |
|---|---|---|---|---|
| Add modified oligomer | CCR-1291H | 45 | 45 | 45 |
| | ZAR-1035 (BPA) | 15 | 15 | 15 |
| Photopolymerizable monomer | Trimethylol propane triacrylate (TMPTA) | 10 | 10 | 10 |
| Thermosetting binder (Epoxy resin) | NC-300H | 10 | 10 | 10 |
| | YDCN-500-90P | 5 | 5 | 5 |
| Thermosetting agent | Dicandamide | 0.15 | 0.15 | 0.15 |
| | CXC-1756 | 0.2 | 0.2 | 0.2 |
| Photoinitiator | Darocur TPO | 2.5 | 2.5 | 2.5 |
| Inorganic filler | Spherical alumina 1 (Particle diameter 0.3 to 0.5 μm) | 80 | 80 | 80 |
| | Spherical alumina 1 (Particle diameter 0.3 to 0.5 μm) | 40 | 40 | 40 |
| | CNT having surface treated with alumina (5 wt %) | 0 | 0.5 | 1.0 |
| Content of inorganic filler in solid content (wt %) | | 57.7 | 57.8 | 57.9 |
| Solvent | DMF | 20 | 20 | 20 |

Comparative Examples 2 and 3

Resin compositions were prepared by mixing the components shown in the following Table 2.

Herein, as the acid modified oligomer, a mixture of an epoxy (meth)acrylate compound derived from cresol novolac and an epoxy (meth)acrylate compound derived from bisphenol A at a weight ratio of 3:1 was used.

A dry film was manufactured by the same method as in Example 1 using the above prepared resin composition, and a printed circuit board including a protective film (solder resist) was completed by the same method as in Example 1 using the dry film.

TABLE 2

Compositions of Examples 2 and 3 (unit: g)

| Components | Component name (or Product name) | Comparative Example 2 | Comparative Example 3 |
|---|---|---|---|
| Acid modified oligomer | CCR-1291H | 45 | 45 |
| | ZAR-1035(BPA) | 15 | 15 |
| Photopolymerizable monomer | Trimethylol propane triacrylate(TMPTA) | 10 | 10 |

TABLE 2-continued

Compositions of Examples 2 and 3 (unit: g)

| Components | Component name (or Product name) | Comparative Example 2 | Comparative Example 3 |
|---|---|---|---|
| Thermosetting binder (Epoxy resin) | NC-300H | 15 | 15 |
| | YDCN-500-90P | 10 | 10 |
| Thermosetting agent | Dicandamide | 0.15 | 0.15 |
| | CXC-1756 | 0.2 | 0.2 |
| Photoinitiator | Darocur TPO | 2.5 | 2.5 |
| Inorganic filler | BaSO$_4$ | 20 | 80 |
| Content of inorganic filler in soild content (wt %) | | 17.0 | 45.0 |
| Solvent | DMF | 20 | 20 |

Experimental Examples

The physical properties of the dry films and the printed circuit boards manufactured in the above examples and comparative examples were measured in the following way.

Experimental Example 1

Evaluation of Developability (Sensitivity)

A 12 μm copper foil laminated plate, from Mitsui Mining & Smelting Co., Ltd., was cut into a 5 cm×5 cm square, and fine roughness was formed on the surface of the copper foil by chemical etching.

After removing the release film of each of the dry films manufactured in the above examples and comparative examples, the film layer was vacuum-laminated on the copper foil laminated plate (substrate) where roughness is formed, with a vacuum laminator (MVLP-500 from Meiki Co., Ltd.).

Then, a negative-type photomask having a hole shape with a diameter of 80 μm was closely adhered thereto, and exposure to UV having a wavelength range of 365 nm was carried out at an exposure amount of 350 mJ/cm$^2$.

Thereafter, the PET film was removed, and development with an alkaline solution of 1 wt % Na$_2$CO$_3$ at 31° C. was carried out for a period of time, thereby forming a pattern.

Then, the shape of the above-formed pattern was observed with a SEM, so that evaluation was carried out according to the following criteria.

1: The cross-section is straight-shaped, and no film residue remains at the bottom.
2: The cross-section is not straight-shaped, and there is an undercut or an overhang in the hole shape.
3: Observed in an undeveloped state.
4: No pattern formed with overdevelopment.

Experimental Example 2

Measurement of Acid Resistance

A copper foil laminated plate (thickness: 0.1 mm, copper foil thickness: 12 μm, LG-T-500GA from LG Chem Ltd.) was cut into a 5 cm×5 cm square, and fine roughness was formed on the surface of the copper foil by chemical etching.

After removing the release film of each of the dry films manufactured in the above examples and comparative examples, the film layer was vacuum-laminated on the copper foil laminated plate (substrate) where roughness is formed, with a vacuum laminator (MVLP-500 from Meiki Co., Ltd.).

Then, a negative-type photomask having a hole shape with a diameter of 80 μm was closely adhered thereto, and exposure to UV having a wavelength range of 365 nm was carried out at an exposure amount of 350 mJ/cm$^2$.

Thereafter, the PET film was removed, development with an alkaline solution of 1 wt % Na$_2$CO$_3$ at 31° C. was carried out for a period of time, and photocuring was carried out at an exposure amount of about 1000 mJ/cm$^2$.

Thereafter, heat curing at 170° C. was carried out for 1 hour to manufacture a specimen.

The above specimen was treated with a 10 wt % sulfate solution (H$_2$SO$_4$) at 25° C. for 30 minutes, and observed as to the state of a coated film, so that evaluation was carried out according to the following criteria.

1: No release and no discoloration of the DFSR.
2: Started to generate visible release/discoloration of the DFSR.
3: Generation of severe release/discoloration of the DFSR Experimental Example 3

Measurement of Absorbance

Copper foil of ICS-25 um from Iljin Material Industries Co., Ltd. was cut into an 11 cm×11 cm square, and its mass was measured. Then each of the dry films manufactured in the examples and the comparative examples was cut into a 10 cm×10 cm square, and the release films were removed. Then a specimen was manufactured in the same manner as the sample for PCT thermal resistance measurement, and its mass was measured.

The specimen was treated under the condition of a temperature of 85° C. and humidity of 85%, for 24 hours, using isothermal-isohumidity equipment (SH-941 from ESPEC Corp.), and its mass was measured.

$$\text{Moisture absorption rate (\%)} = (\text{mass of absorbed moisture/mass of sample}) \times 100 \qquad 1)$$

$$\begin{aligned}\text{Mass of absorbed moisture} = &(\text{mass of specimen after} \\ &\text{isothermal-Isohumidity treatment}) - (\text{mass of} \\ &\text{specimen before isothermal-isohumidity treatment})\end{aligned} \qquad 2)$$

$$\begin{aligned}\text{Mass of sample} = &(\text{mass of specimen before isothermal-isohumidity treatment}) - (\text{mass of copper foil})\end{aligned} \qquad 3)$$

Experimental Example 4

Measurement of Pencil Hardness

A specimen was manufactured in the same manner as in the above Experimental Example 2 [Measurement of acid resistance], and cut into an 11 cm×11 cm square.

Using a set of pencils for measuring hardness (Mitsubishi), and a pencil hardness tester (CK Trading Co.), a scratch level of the specimen at a constant speed under a load of 100 g was measured.

Using a pencil having hardness from B to 9H of the set of pencils, the hardness of the pencil which did not release the coated film was identified.

Experimental Example 5

Measurement of Insulation Resistance

Using a vacuum laminator (MVLP-500 from Meiki Co., Ltd.), each of the dry films manufactured in the examples and the comparative examples was vacuum-laminated on an FR-4 substrate where a comb-type electrode of pattern B of the IPC standards was formed.

Then, a negative-type photomask having a hole shape with a diameter of 80 μm was closely adhered to the substrate, and exposure to UV having a wavelength range of 365 nm was carried out at an exposure amount of 350 mJ/cm².

Thereafter, the PET film was removed, development with an alkaline solution of 1 wt % Na$_2$CO$_3$ at 31° C. was carried out for a period of time, and photocuring was carried out at an exposure amount of about 1000 mJ/cm².

Thereafter, heat curing at 170° C. was carried out for 1 hour to manufacture a specimen.

The insulation resistance value of the electrodes in the obtained specimen was measured at an applied voltage of 500 V.

Experimental Example 6

Measurement of Thermal Conductivity

A 12 μm copper foil laminated plate (3EC-M3-VLP from Mitsui Mining & Smelting Co., Ltd.) was cut into a 15 cm×15 cm square, and each of the dry films manufactured in the examples and the comparative examples was vacuum-laminated several times on the copper foil laminated plates prepared in the predetermined size, using a vacuum laminator (MVLP-500 from Meiki Co., Ltd.), thereby obtaining a thickness of about 100 μm.

Then, a negative-type photomask having a hole shape with a diameter of 12.7 μm was closely adhered to the substrate, and exposure to UV having a wavelength range of 365 nm was carried out at an exposure amount of 350 mJ/cm².

Thereafter, the PET film was removed, development with an alkaline solution of 1 wt % Na$_2$CO$_3$ at 31° C. was carried out for a period of time, and photocuring was carried out at an exposure amount of about 1000 mJ/cm².

Thereafter, heat curing at about 170° C. was carried out for 1 hour, and the copper foil was removed using an etching solution, thereby manufacturing a specimen for measuring thermal conductivity.

The thermal conductivity was calculated by the formula [density×specific heat×thermal diffusion coefficient], wherein the density was measured using Mettler Toledo equipment, and the specific heat and the thermal diffusion coefficient were measured using LFA 447 equipment from Netzch.

The measurement results of the above Experimental Examples 1 to 6 are shown in the following Table 3.

TABLE 3

Measurement results of Experimental Examples 1 to 6

|  | Example 1 | Example 2 | Comparative Example 1 | Comparative Example 2 | Comparative Example 3 |
|---|---|---|---|---|---|
| Sensitivity | 9 | 9 | 8 | 12 | 8 |
| Acid resistance | 0 | 0 | 0 | 0 | 0 |
| Absorbance (%) | 0.8 | 0.7 | 0.7 | 0.5 | 0.7 |
| Pencil hardness | 7H | 8H | 7H | 4H | 7H |
| Insulation resistance (*10$^{11}$ Ω) | 9.0 | 8.5 | 3.2 | 23 | 30 |
| Thermal conductivity (W/mK) | 1.24 | 2.41 | 0.51 | 0.23 | 0.24 |

As shown in the results of measurement and evaluation of the above Table 3, it is confirmed that the DFSR of the examples has excellent developability, photocuring property, and physical properties, and improved heat radiation property without decreased insulating property.

Particularly, in case of the specimen using the dry film of Comparative Example 1, the content of the inorganic filler is 57.7 wt %, and the thermal conductivity calculated by the Bruggeman equation and the actually measured thermal conductivity were about 0.5 W/mK, whereas the specimens of Examples 1 and 2 had a level of content of the inorganic filler, equivalent to the comparative examples, while implementing thermal conductivities of 1.00 W/mK or more.

The specimen using the dry film of Comparative Example 1 should have the content of the used alumina filler of 70 wt % or more by the Bruggeman equation, in order to implement thermal conductivity of 1.00 W/mK or more. However, in Examples 1 and 2, high thermal conductivity may be implemented without increasing the content of the Inorganic filler a lot.

That is, the DFSR of the examples may secure electrical insulation, thereby having a high thermal conductivity property and electromagnetic wave absorption performance without reducing the dielectric strength, and may implement an excellent thermal conductivity property, electromagnetic wave absorption performance, and dielectric strength with a relatively small thickness.

[Reference] Bruggeman Equation $$1 - V_f = \frac{K_f - K}{K_f - K_m}\left(\frac{K_m}{K}\right)^{1/3}$$

$K$: thermal conductivity of the composites
$K_f$: thermal conductivity of ceramic fillers
$K_m$: thermal conductivity of Polymer
$V_f$: the volume fraction of ceramics

*In case of the specimen of the above Comparative Example 1, the specific gravity was applied as 4 for alumina and 1.1 for the resin.

What is claimed is:

1. A photocurable and thermosetting resin composition, comprising an acid modified oligomer, a photopolymerizable monomer, a thermosetting binder resin, a photoinitiator, two or more kinds of spherical alumina particles having different particle diameters from each other, a carbon compound having a surface coated with a thermal conductive ceramic compound, and an organic solvent,
   wherein the carbon compound having a surface coated with the thermal conductive ceramic compound contains 0.5% to 20% by weight of the thermal conductive ceramic compound, and 80% to 99.5% by weight of the carbon compound.

2. The photocurable and thermosetting resin composition of claim 1, wherein at least one kind of the spherical alumina particles has a particle diameter of 0.1 μm or less.

3. The photocurable and thermosetting resin composition of claim 1, wherein at least one kind of the spherical alumina particles has a particle diameter from 0.2 μm to 0.7 μm.

4. The photocurable and thermosetting resin composition of claim 1, wherein the carbon compound having a surface coated with the thermal conductive ceramic compound is in a range of 1.1% by weight or less.

5. The photocurable and thermosetting resin composition of claim 1, wherein the thermal conductive ceramic compound contains one or more selected from the group consisting of alumina (Al$_2$O$_3$), boron nitride (BN), aluminum nitride (AlN), silicon carbide (SiC), magnesium oxide (MgO), zinc oxide (ZnO), and aluminum hydroxide (Al(OH)$_3$).

6. The photocurable and thermosetting resin composition of claim 1, wherein the carbon compound contains one or more selected from the group consisting of graphite, graphene, and carbon nanotubes.

7. The photocurable and thermosetting resin composition of claim 1, wherein the carbon compound having a surface coated with the thermal conductive ceramic compound has an average particle diameter of 0.5 μm to 4 μm.

8. The photocurable and thermosetting resin composition of claim 1, wherein the acid modified oligomer includes an epoxy (meth)acrylate-based compound.

9. The photocurable and thermosetting resin composition of claim 8, wherein the epoxy (meth)acrylate-based compound has a weight average molecular weight of 5000 to 50,000.

10. The photocurable and thermosetting resin composition of claim 1, wherein the photopolymerizable monomer includes one or more compounds selected from the group consisting of a polyfunctional compound having two or more vinyl groups in a molecule, and a polyfunctional (meth)acrylate compound having two or more (meth)acryloyl groups in a molecule.

11. The photocurable and thermosetting resin composition of claim 1, wherein the photoinitiator includes one or more selected from the group consisting of a benzoin-based compound, an acetophenone-based compound, an anthraquinone-based compound, a thioxanthone compound, a ketal compound, a benzophenone-based compound, an α-aminoacetophenone compound, an acylphosphine oxide compound, an oxime ester compound, a biimidazole-based compound, and a triazine-based compound.

12. The photocurable and thermosetting resin composition of claim 1, wherein the thermosetting binder resin includes one or more functional groups selected from the group consisting of an epoxy group, an oxetanyl group, a cyclic ether group, and a cyclic thioether group.

13. The photocurable and thermosetting resin composition of claim 1, wherein the thermosetting binder resin includes one or more resins selected from the group consisting of a polyfunctional epoxy resin having two or more epoxy groups, a polyfunctional oxetane resin having two or more oxetanyl groups, and an episulfide resin having two or more thioether groups.

14. The photocurable and thermosetting resin composition of claim 1, comprising the acid modified oligomer is in a range of 5% to 75% by weight;
the photopolymerizable monomer is in a range of 1% to 40% by weight;
the thermosetting binder resin is in a range of 0.5% to 40% by weight;
the photoinitiator is in a range of 0.1% to 20% by weight;
the two or more kinds of spherical alumina particles having different particle diameters from each other are in a range of 1% to 75% by weight;
the carbon compound having a surface coated with the thermal conductive ceramic compound is in a range of 0.2% to 1.0% by weight; and
the organic solvent is in a range of 1% to 90% by weight.

15. The photocurable and thermosetting resin composition of claim 1, further comprising one or more inorganic fillers selected from the group consisting of barium sulfate, barium titanate, amorphous silica, crystalline silica, fused silica, spherical silica, talc, clay, magnesium carbonate, calcium carbonate, aluminum oxide, aluminum hydroxide, and mica.

16. The photocurable and thermosetting resin composition of claim 15, wherein a sum of contents of the two or more kinds of spherical alumina particles having different particle diameters from each other and the inorganic filler is 30% to 60% by weight in the solid content except for the organic solvent.

17. A dry film solder resist manufactured by using the photosensitive resin composition of claim 1.

18. The dry film solder resist of claim 17, wherein a cured or dried product of the photosensitive resin composition is included.

19. The dry film solder resist of claim 17, wherein the dry solder resist is used as a protective film for a printed circuit board.

20. The dry film solder resist of claim 17, wherein the dry solder resist has a thickness of 10 μm to 150 μm, and a thermal conductivity of 1.10 W/mK or more.

21. The dry film solder resist of claim 20, wherein the dry solder resist has an insulation resistance of $10.0*10^{11}\Omega$ or less.

22. A circuit board comprising the dry film solder resist of claim 17.

* * * * *